(12) United States Patent
Schatz et al.

(10) Patent No.: US 12,235,576 B2
(45) Date of Patent: Feb. 25, 2025

(54) METHOD AND APPARATUS FOR MANUFACTURING NANOSTRUCTURES FROM A MATERIAL LAYER HAVING A THICKNESS BELOW 1 μm

(71) Applicant: Julius-Maximilians-Universitat Wurzburg, Wurzburg (DE)

(72) Inventors: Enno Schatz, Wurzburg (DE); Bert Hecht, Zell (DE); Thien Anh Le, Wurzburg (DE); Henriette Maass, Wurzburg (DE)

(73) Assignee: Julius-Maximilians-Universitat Wurzburg, Wurzburg (DE)

( * ) Notice: Subject to any disclaimer, the term of this patent is extended or adjusted under 35 U.S.C. 154(b) by 598 days.

(21) Appl. No.: 17/420,901

(22) PCT Filed: Jan. 24, 2020

(86) PCT No.: PCT/EP2020/051725
§ 371 (c)(1),
(2) Date: Jul. 6, 2021

(87) PCT Pub. No.: WO2020/152316
PCT Pub. Date: Jul. 30, 2020

(65) Prior Publication Data
US 2022/0066315 A1    Mar. 3, 2022

(30) Foreign Application Priority Data

Jan. 24, 2019 (EP) ..................... 19153630

(51) Int. Cl.
G03F 7/00 (2006.01)
B82Y 30/00 (2011.01)
B82Y 40/00 (2011.01)

(52) U.S. Cl.
CPC .......... *G03F 7/0002* (2013.01); *B82Y 30/00* (2013.01); *B82Y 40/00* (2013.01)

(58) Field of Classification Search
None
See application file for complete search history.

(56) References Cited

U.S. PATENT DOCUMENTS

| 2005/0191419 A1 | 9/2005 | Helt |
| 2010/0051701 A1 | 3/2010 | Ogata et al. |
| 2014/0255653 A1 | 9/2014 | Weiss et al. |
| 2017/0018660 A1 | 1/2017 | Kumai et al. |

FOREIGN PATENT DOCUMENTS

| EP | 2 720 519 A | 4/2014 |
| JP | 2007-076288 A | 3/2007 |

OTHER PUBLICATIONS

International Search Report dated Apr. 17, 2020, issued in PCT Application No. PCT/EP2020/051725, filed Jan. 25, 2020.
Written Opinion dated Apr. 17, 2020, issued in PCT Application No. PCT/EP2020/051725, filed Jan. 25, 2020.

*Primary Examiner* — Robert J Grun
(74) *Attorney, Agent, or Firm* — Workman Nydegger

(57) ABSTRACT

Provided is a method and an apparatus of manufacturing nano-structures by cutting out portions of a material layer and removing the cut-out portions.

17 Claims, 8 Drawing Sheets

METHOD AND APPARATUS FOR MANUFACTURING NANOSTRUCTURES FROM A MATERIAL LAYER HAVING A THICKNESS BELOW 1 μm

FIELD

The present disclosure relates to manufacturing nano-structures. In particular, the present disclosure relates to mechanically structuring a (monocrystalline) material layer (or film) having a thickness below 1 μm (e.g., a thickness of about 100 nm or about 10 nm).

BACKGROUND

When employing nano-imprint lithography for structuring ultra-thin films (with a thickness in the nanometer range), the material layer is re-shaped through plastic deformation by forcing a die into the material layer. Although this process allows for a fast and cost-efficient production of nano-structures, the plastic deformation affects the crystallinity of the material and may hence degrade the physical properties of the product.

SUMMARY

The present invention alleviates this issue by reducing the amount of material that is plastically deformed by cutting out portions of the material layer, as opposed to forcing the material into die cavities for re-shaping.

According to the present disclosure, a method of manufacturing nano-structures on a substrate (e.g., a glass substrate) may comprise depositing a material layer (e.g., a crystalline homogeneous metal such as crystalline homogenous gold, silver, copper, aluminum, etc.) on the substrate, wherein the material layer has a thickness below 1 μm, preferably below 100 nm, and more preferably below 10 nm, cutting out portions of the material layer, and removing the cut-out portions from the substrate.

In this regard, the term "nano-structures", as used throughout the description and the claims, particularly refers to structures having a size between 0.1 nm and 100 nm (in at least one dimension). Moreover, the term "material layer", as used throughout the description and the claims, particularly refers to a substantially homogeneous material (e.g., a crystalline material) with a planar surface. Furthermore, the term "substrate", as used throughout the description and the claims, particularly refers to a plate or disc of substantially uniform thickness to which the material layer adheres. The substrate may be of higher (mechanical) stability than the material layer, thereby reducing the requirements on the structural integrity of the material layer before, during and in particular after cutting out portions of the material layer.

In addition, the term "cutting out", as used throughout the description and the claims, particularly refers to mechanically separating a portion of the material layer from another portion of the material layer by forcing a sharp structure of a material which is harder (than the material of the material layer) through the material layer. Notably, cutting causes a localized plastic deformation of the material in the vicinity of the cut, but no substantial (e.g., only a negligible) deformation of the remaining material (particularly if using asymmetric blades, as will be described in more detail below). Finally, the term "removing", as used throughout the description and the claims, particularly refers to mechanically removing (e.g., separating) a portion of the material layer from the substrate.

Thus, instead of reshaping the material layer by plastic deformation of a large amount or even all material of the layer (at high temperature), the material layer may be structured at room temperature or at an elevated temperature (e.g., at a temperature between 1° C. and 300° C., between 10° C. and 100° C. or between 20° C. and 50° C.), wherein the material which remains on the substrate is not dislocated and plastic deformation is mostly avoided (thereby maintaining the crystallinity of the material). For instance, a crystalline homogeneous material layer (or film) having a length and/or width that is more than 1000 times, more than 10,000 times or even more than 100,000 times larger than its thickness may be manufactured by chemical synthesis and structured at room temperature such that its crystallinity is maintained throughout manufacturing.

Cutting out portions of the material layer may include applying a cutting die to the material layer. The cutting die may be longer and/or wider than the material layer, span (substantially) the whole (length and/or width of the) material layer, or only a part of the material layer. The cutting die may comprise protruding portions with sharp circumferential edges (or blades). I.e., when the cutting die is applied to the material layer, the edges cut through the material layer. Moreover, a flexible layer may be arranged between the substrate and the material layer to protect the sharp circumferential edges of the cutting die from wear. The cutting die may further comprise a base with a plurality of parallel surface areas of equal height protruding from the base in a direction perpendicular to the parallel surface areas (which may also be referred to as protruding portions or plateau surfaces throughout the description). Each of said coplanar surface areas may be surrounded by a sharp circumferential edge protruding (from the surface area) in a direction perpendicular to the surface area.

The shape of the cross-section of an edge may be asymmetric to the direction perpendicular to the surface of the protruding portion. For example, the inner side of the cross-section may be inclined relative to the surface of the protruding portion by a first angle (or within a first angle range) whereas the outer side of the cross-section may be inclined relative to the surface of the protruding portion by a second angle (or within a second angle range), the angles (or angle ranges) being different (for example, the outer side may be more inclined than the inner side). In particular, the cross-section of the edge may be asymmetric to the direction perpendicular to the surface of the protruding portion in that the inner side is sloped whereas the outer side is perpendicular to the surface of the protruding portion.

In other words, the surface at the inner side of the edge, i.e. the surface connecting the plateau surface and the edge tip may not be perpendicular to the plateau surface but may be inclined by an angle of less than 90°. This may improve adherence between the cut-out portion and the cutting die, as the cut-out portion may be clamped by the circumferential edge. Moreover, the shape of the cross-section of the edge may be barbed (towards the inner side of the edge) to further improve adherence between the cut-out portion and the cutting die. In addition, if the outer side of the edge is (substantially) perpendicular to the plateau surface, plastic deformation of the material remaining on the substrate may be minimized.

The height of the circumferential edge above the surface area may match the thickness of the material layer. For example, the height may be below 1 μm, preferably below 100 nm, and more preferably below 10 nm. Hence, when the edges cut through the material layer, the coplanar surface areas may engage with the material layer. If there is mechanical contact between the cut-out portions and the protruding portions, the cut-out portions may adhere to the protruding portions and the cut-out portions of the material layer may be removed from the substrate by withdrawing the die, thereby pulling the cut-out portions off the substrate. In this regard, the adhesive forces may be controlled by controlling the size of the contact area, which depends, inter alia, on the height and the shape of the edges.

In other words, the cut-out portions may stick to the cutting die such that when the cutting die is retracted, the cut-out portions move with the cutting die and are removed from the substrate. I.e., when the coplanar surface areas engage with the material layer, the adhesive forces between the coplanar surface areas and the cut-out portions may be stronger than the adhesive forces between the cut-out portions and the substrate, such that the cut-out portions adhere to the cutting die when the cutting die is withdrawn from the substrate. After withdrawing the cutting die, the cut-out portions may be removed from the cutting die and the cutting die may be reused.

Removing the cut-out portions from the substrate may be performed in a first fluid having a first pressure which is higher than a second pressure of a second fluid between the cut-out portions and the cutting die.

Applying the cutting die to the material layer may further comprise (linearly) moving the cutting die parallel to a crystal axis of the material layer to avoid ripples at the cut surface.

If the cutting die can be reused, (slow) serial processes like ion beam milling, electron-beam lithography, etc., may be used for cutting die production without substantially limiting the speed of the nano-structure manufacturing process that employs the cutting die(s). Depending on the number of cutting dies that are used alternately (e.g., a single cutting die, or two or more cutting dies alternately), the time required for structuring one material layer may be as low as the time required for cutting out portions of the substrate and removing the cut-out portions from the substrate (if the cutting die spans the whole material layer). If cutting dies are not used alternately, the time required for structuring one material layer may also include the time for removing the cut-out portions from the cutting die.

Removing the cut-out portions from the cutting die may be achieved in various ways including chemical processes, such as etching, but also mechanical processes, such as shaking the cut-out portions off the cutting die (e.g., in an ultrasonic bath). Moreover, several dies may be applied sequentially to obtain more complex structures, such as e.g. Moiré patterns.

While applying the cutting die to the material layer, portions which remain on the substrate after having removed the cut-out portions from the substrate may not, except for the edge, come into contact with the cutting die. In particular, the cutting die may not make contact with the coplanar surface areas of non-cut-out portions which remain on the substrate after having removed the cut-out portions from the substrate.

In other words, while applying the cutting die to the material layer, a gap may be maintained between the cutting die and a surface of the portions remaining on the substrate (after removal of the cut-out portions from the substrate). The gap may avoid that the portions that are to remain on the substrate adhere to the cutting die when the cutting die is retracted.

According to the present disclosure, an apparatus for structuring a material layer may comprise a cutting die, a sensor, and a controller. The cutting die may comprise a base with a plurality of parallel surface areas of equal height protruding from the base in a direction perpendicular to the parallel surface areas, each of said coplanar surface areas being surrounded by a circumferential edge protruding in said direction from a parallel surface area, wherein a height of the circumferential edge above said surface area is below 1 µm. The sensor may be configured to detect a position and/or an orientation and/or a thickness of the material layer. The controller may be configured to align the cutting die and the material layer and control a movement of the cutting die parallel to said direction, for cutting out portions of the material layer and removing the cut-out portions (from the material layer). The apparatus may further comprise a support which may be configured to support a substrate on which the material layer is deposited.

As described above, a shape of a cross-section of the edge may be (mirror-symmetric or) asymmetric. In particular, the shape of the cross-section may have an outer side which is perpendicular to the parallel surface areas. Moreover, an area between the outer sides of the edges may have a smaller height than the surface areas within the edges to avoid contact between said area and the material layer when cutting through the material layer. Furthermore, the surface area may be provided with an adhesive layer. In addition, aligning the cutting die and the material layer may further comprise orienting the outer sides of the edges parallel to a crystal axis of the material layer (to avoid ripples at the cut surface when cutting through the material layer).

The structured material (e.g., the material remaining on the substrate), which may comprise a conductive or a semi-conductive material, may be integrated into optoelectronic devices. For example, an array of nanostructures may be used for optical antennas or metasurfaces, thereby realizing sensing areas for on-chip measurements or ultra-thin optical elements. Furthermore, the nano-structures may be used for electronic connections or circuitry and devices like ultra-small displays. In addition, the structured material may comprise (separate) nano-structures (e.g., nano-rods) that can be immersed in a solution and used for biosensing or medical applications. In this regard, it is to be noted that depending on the application, the structured material may be removed or remain on the substrate.

It will be appreciated that all features and attendant advantages of the disclosed method may be realized by the disclosed apparatus and vice versa. Moreover, it is noted that throughout the description, features in brackets are to be regarded as optional.

BRIEF DESCRIPTION OF THE DRAWINGS

The foregoing aspects and many of the attendant advantages will become more readily appreciated as the same becomes better understood by reference to the following detailed description, when taken in conjunction with the accompanying drawings, wherein like reference numerals refer to like parts throughout the various views, unless otherwise specified.

Notably, the drawings are not drawn to scale and unless otherwise indicated, they are merely intended to conceptually illustrate the structures and procedures described herein.

DETAILED DESCRIPTION

Figure 1:
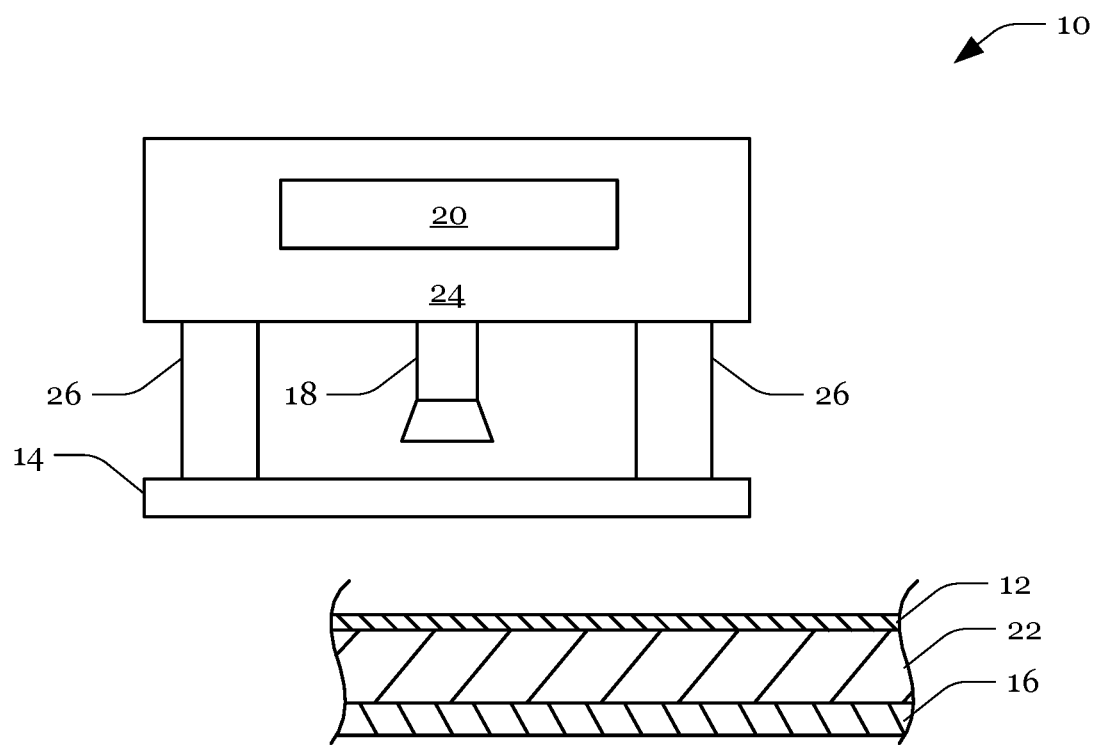
FIG. 1 and FIG. 2 show schematic views of an exemplary apparatus for structuring a conductive or semi-conductive material layer and illustrate positioning the die relative to the material layer.

FIG. 1 shows a schematic view of an exemplary apparatus 10 for structuring a (monocrystalline) material layer 12. The apparatus 10 comprises a cutting die 14, a support 16, a sensor 18, and a controller 20. After placing the substrate 22 on the support 16, the sensor 18 detects the position of the material layer 12 and provides information on the position to the controller 20. For example, as shown in FIG. 1, the sensor 18 may comprise a camera for detecting optical marks on the substrate 22 or on the material layer 12. The controller 20 may then cause an alignment procedure involving a relative movement (parallel to the surface of the material layer 12 along the length and/or width direction) between the structuring device 24 and the support 16. Notably, the support 16 can be made of the same material as the substrate 22 or the substrate 22 itself can be used simultaneously as both, support 16 and substrate 22.

If the size of the cutting die 14 equals the size of the whole material layer 12 (i.e., if the cutting die 14 spans the whole material layer 12), the (whole) material layer 12 may be structured in a single step, thus requiring only a single alignment procedure. If the size of the cutting die 14 is smaller than the material layer 12, the cutting die 14 may be sequentially applied to different areas (of the material layer 12), wherein the alignment procedure may be performed for each area. However, instead of a single cutting die 14 being sequentially applied to different areas, multiple (identical) cutting dies 14 may be used in parallel, which may also require only a single alignment procedure. The alignment procedure may also (implicitly or explicitly) take into account the crystal orientation of the material layer 12. For example, the optical marks may have been positioned on the layer 12 (inter alia) based on the crystal orientation of the material layer 12 or the crystal orientation of the material layer 12 may be determined as part of the alignment procedure.

In addition, cutting dies 14 of different sizes may be used to structure the material layer 12. For example, a cutting die 14 which spans the whole material layer 12 may be applied to the material layer 12 before or after a smaller cutting die 14 is applied to an area of the material layer 12. Moreover, multiple (different) cutting dies 14 which span the whole material layer 12 may be applied to the material layer 12 in sequence and/or multiple different cutting dies 14 may be applied to a same area in sequence, wherein each application of a cutting die 14 may require an alignment procedure to be carried out (in preparation of the application).

Figure 2:
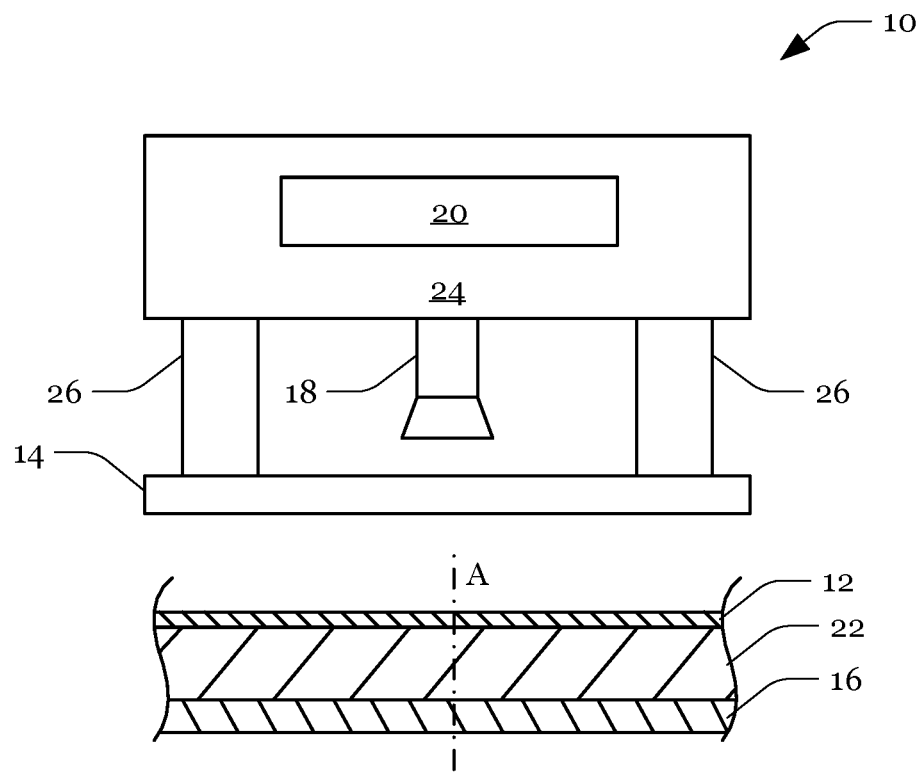
Figure 3:
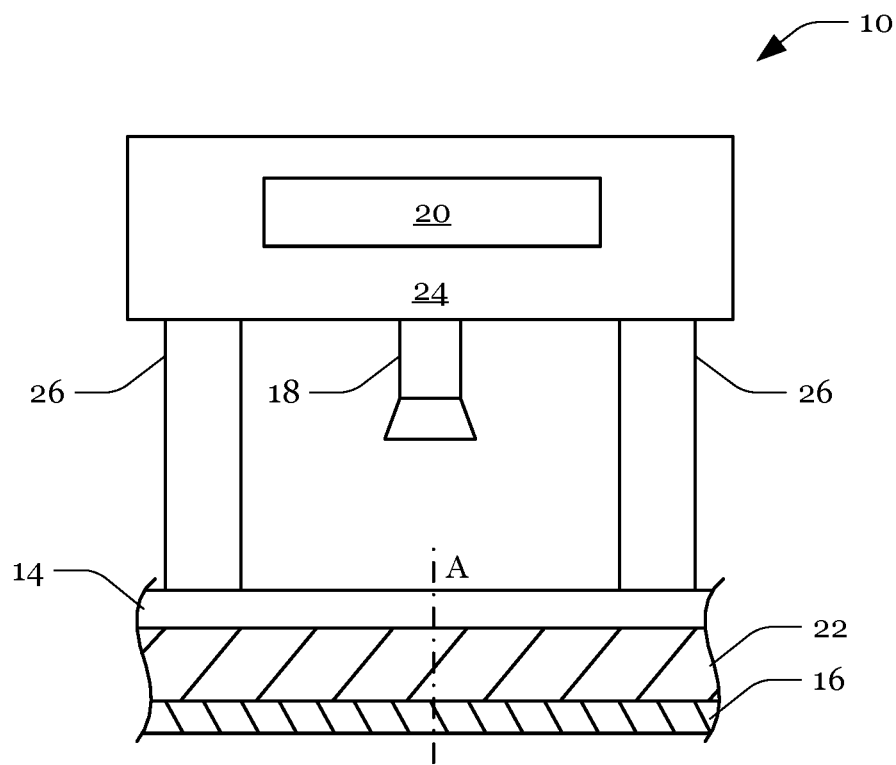
FIG. 3 and FIG. 4 show schematic views of the apparatus of FIG. 1 and FIG. 2 and illustrate applying the die to the material layer.
Figure 4:
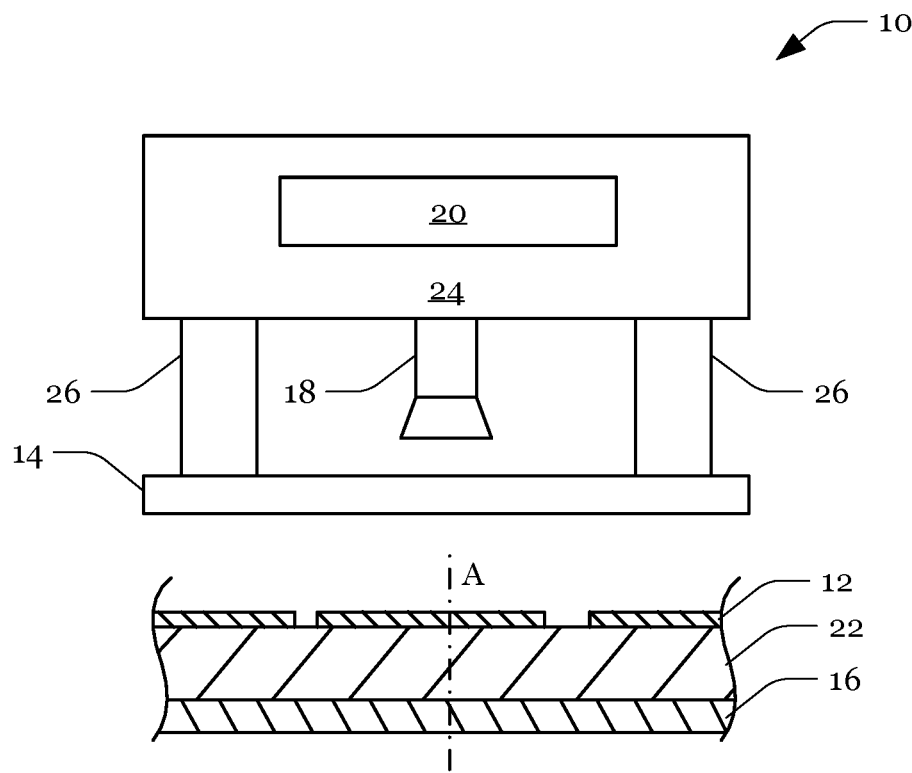
Figure 5:
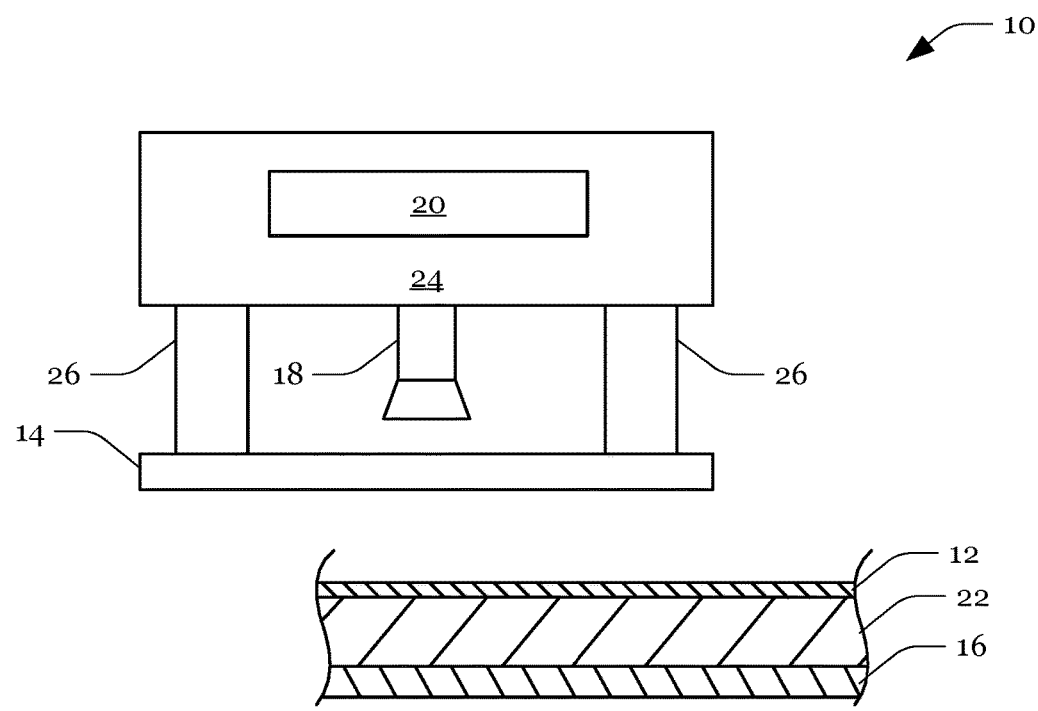
FIG. 5 shows a schematic view of the apparatus of FIG. 1 to FIG. 4 and illustrates the start of a new cycle.

Once aligned, the cutting die 14 may be linearly moved (in a direction A perpendicular to the surface of the material layer 12) against the material layer 12 as illustrated in FIG. 2 and FIG. 3. Heretofore, the cutting die 14 may be connected to an actuator through a linear bearing 26. For example, the structuring device 24 may comprise an electric motor or a piezoelectric element controlled by the controller 20, which forces the cutting die 14 onto the material layer 14, thereby cutting out portions of the material layer 12 and removing the cut-out portions from the substrate 22, as shown in FIG. 4. Once completed, a new cycle may be started by performing a new alignment procedure, as illustrated in FIG. 5. Notably, if the cutting die 14 is reused, a cleaning process may be performed.

Figure 6:
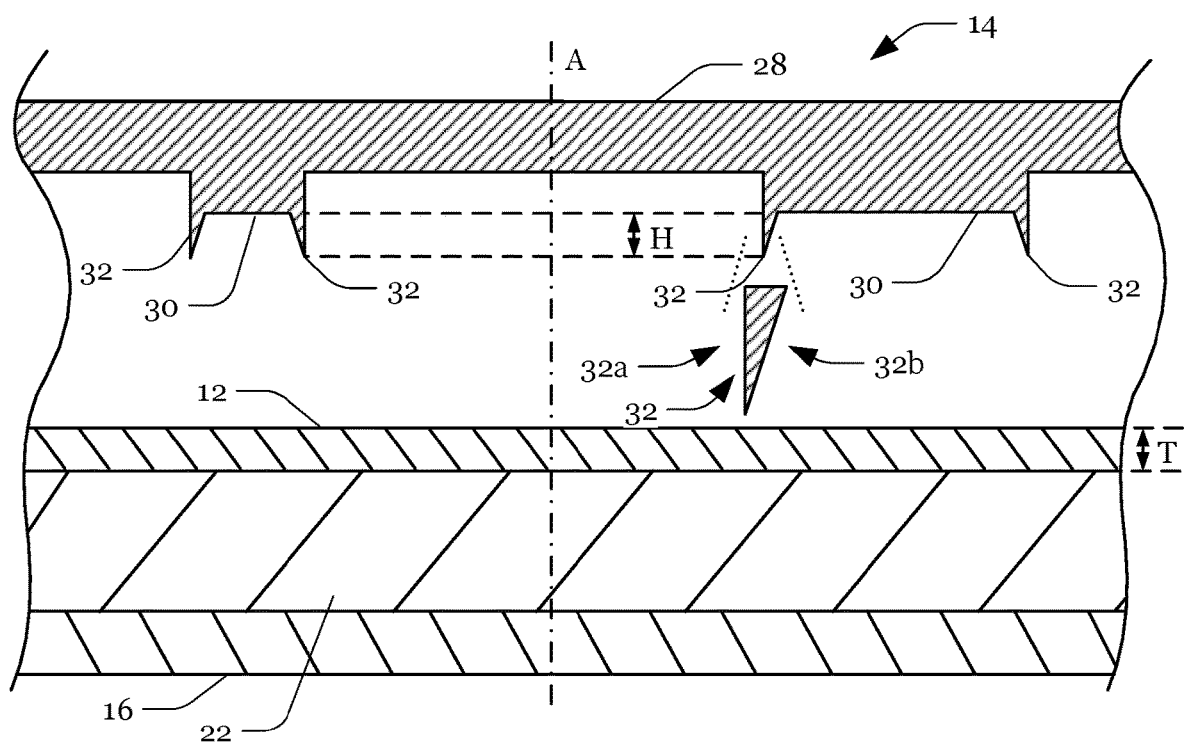
FIG. 6 shows s schematic cross-sectional view of a part of an exemplary cutting die.
Figure 7:
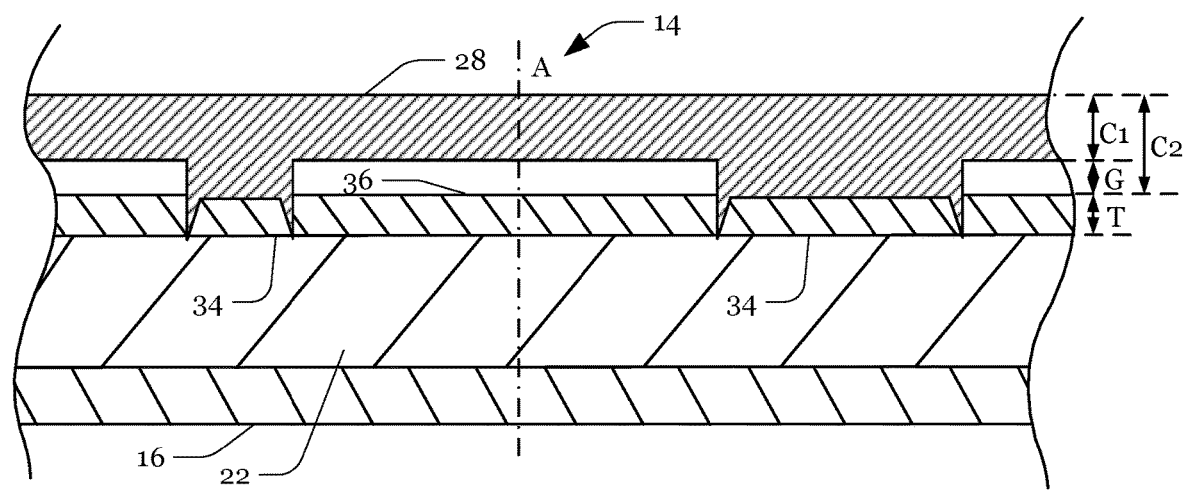
FIG. 7 and FIG. 8 illustrate cutting out portions of the material layer and removing the cut-out portions with the cutting die of FIG. 6.

FIG. 6 shows a cross-sectional view of an exemplary cutting die 14. The cutting die 14 has a base 28 with a plurality of parallel surface areas 30 of equal height H protruding from the base 28 in the direction A (i.e., perpendicular to the parallel surface areas 30). The (coplanar) surface areas 30 are surrounded by circumferential edges 32 protruding from the parallel surface areas 30 in the direction A. The height H of the circumferential edges 32 above the surface areas 30 matches the thickness T of the material layer 14. I.e., the height H is equal to or (slightly) taller than the thickness T, such that when the surface areas 30 come into mechanical contact with the material layer 12, the portions 34 of the material layer 12 within the edges 32 are cut out from the material layer 12 as illustrated in FIG. 7.

As can be seen from the enlarged view of the edge 32 in FIG. 6, the shape of the cross-section of the edge 32 may be triangular, wherein the outer side 32a is parallel to the direction A and the inner side 32b is sloped towards the surface area 30 (i.e., the outer side 32a is inclined by an angle of 90° and the inner side is inclined by an angle of less than 90° relative to the surface area 30). Due to the shape of the cross-section, the cut-out portions 34 experience more strain than the nano-structures 36 that remain on the substrate 22 which adds to conserving the crystallinity of the produced nano-structures 36.

Figure 8:
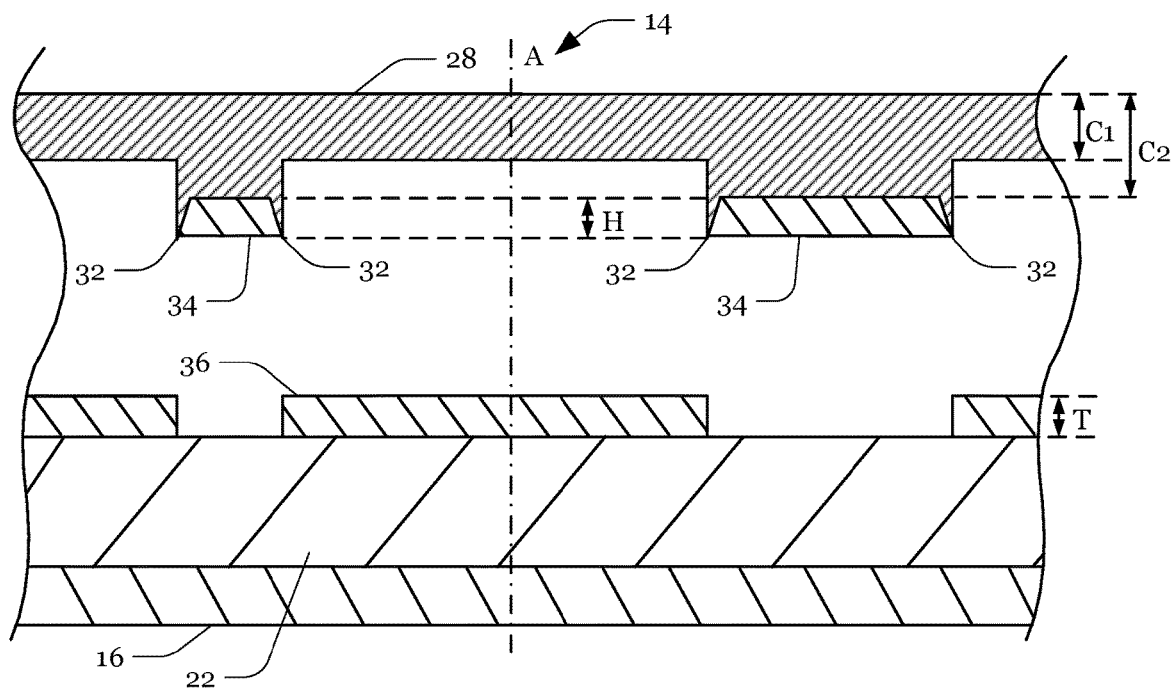

After cutting out portions 34 of the material layer 12, the cut-out portions 34 may be removed from the substrate 22. Removing the cut-out portions 34 may be performed after the cutting die 14 has been withdrawn. However, if the cut-out portions 34 adhere to the cutting die 14 as illustrated in FIG. 8, the cut-out portions 34 may also be removed by withdrawing the cutting die 14. In other words, the adhesive forces between the cutting die 14 and the cut-out portions 34 may be larger than the adhesive forces between the cut-out portions 34 and the substrate 22. This may be achieved by selecting a suitable substrate 22 or by adding an adhesive layer (not shown) to the surface area 30 (and the inner side 32b of the edge 32). For example, in the case of no adhesive layer, the cutting die 14 may be made of $Si/Si_3N_4$, the material layer 12 may be made of gold, and the cutting may be performed at 1° C. to 300° C. or at 10° C. and 100° C. (e.g., at 90° C.).

The adhesive layer may be less robust than the (material of the) cutting die 14 but may be re-applied to the cutting die 14 when needed (e.g., after each cycle or after a number of cycles). As the contact area between the material layer 12 and the cutting die 14 is larger than the contact area between the material layer 12 and the substrate 22, the substrate 22 and the cutting die 14 may also have substantially the same adhesive properties. To avoid that the nano-structure 36 is damaged or pulled off the substrate 22, a gap G may be maintained between the cutting die 14 and the surface of the portions which are to remain on the substrate 22 after having removed the cut-out portions 34 from the substrate 22. In other words, the area between the outer sides 32a of the edges 32 has a height C1 which is smaller than the height C2 of the surface areas 30 within the edges 32 to avoid contact between said area and the material layer 12 when cutting through the material layer 12.

Figure 9:
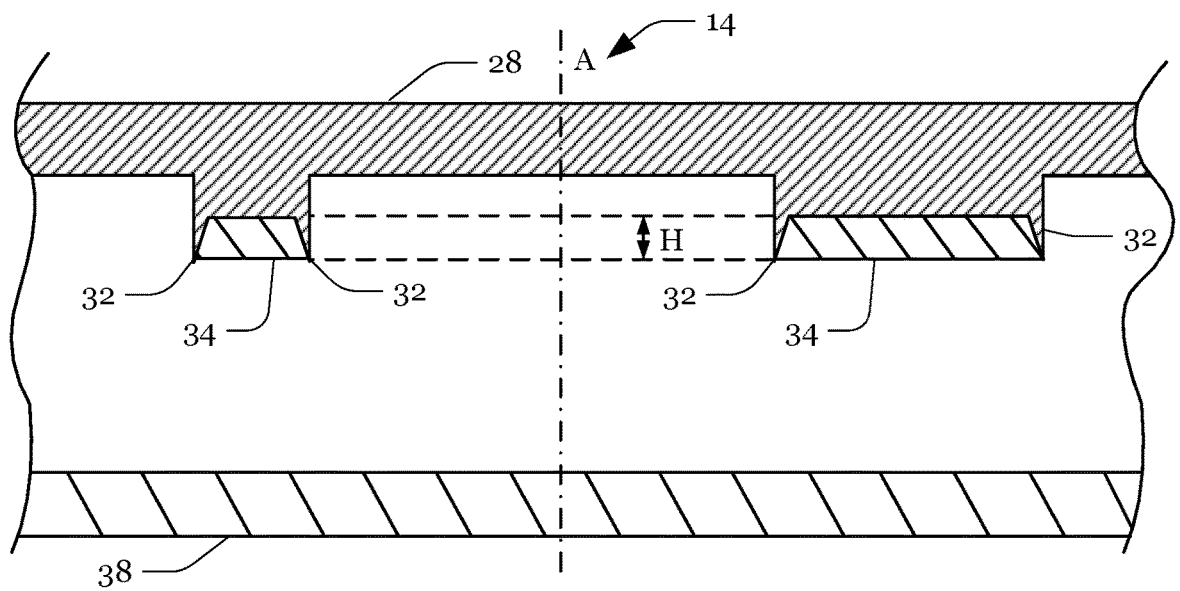
FIG. 9, FIG. 10, and FIG. 11 show exemplary steps for removing the cut-out portions from the cutting die.
Figure 10:
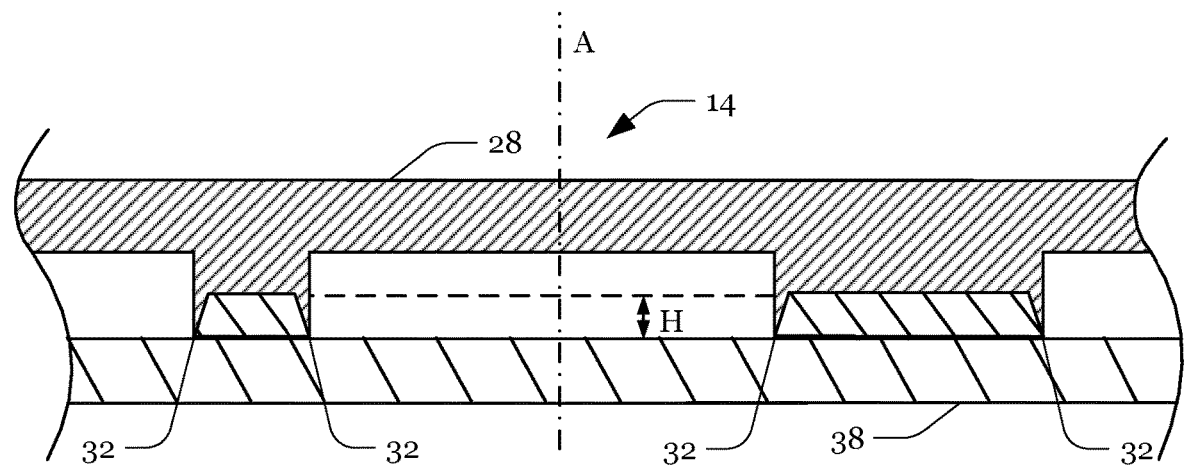
Figure 11:
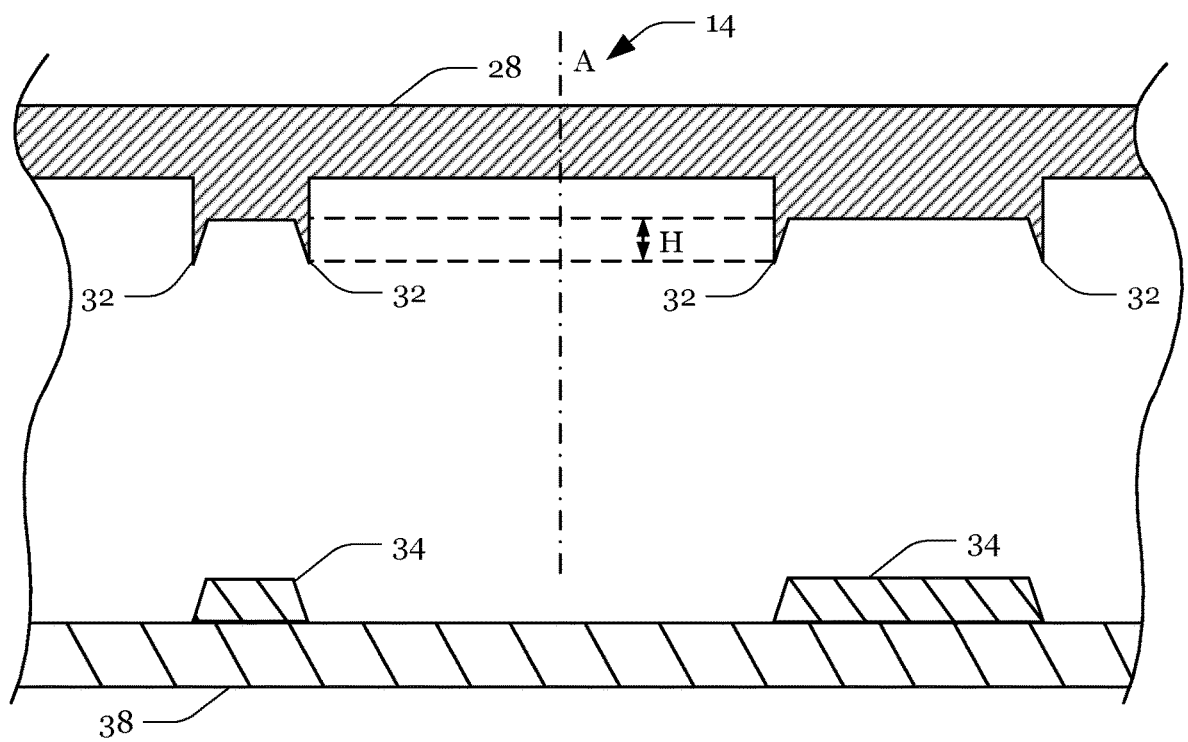
Figure 12:
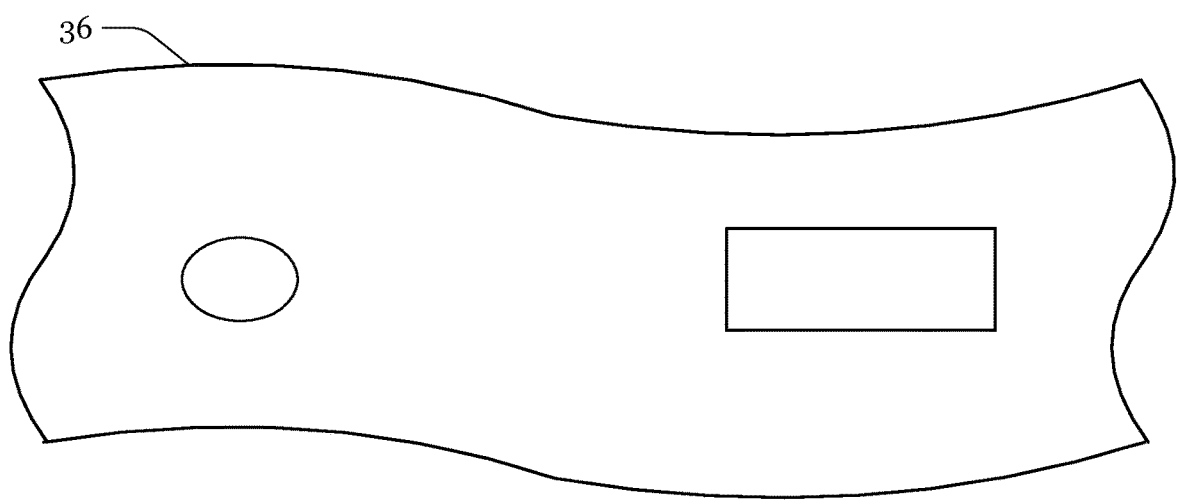
FIG. 12 schematically illustrates a top view of a part of the material layer where portions have been cut out.

As illustrated in FIG. 9, FIG. 10, and FIG. 11, the cut-out portions 34 may be removed from the cutting die 14 by transferring the cut-out portions 34 to another substrate 38. The adhesive forces between the cut-out portions 34 and the other substrate 38 may be larger than the adhesive forces between the cut-out portions 34 and the cutting die 14. This may be achieved by selecting a suitable other substrate 38 or by adding an adhesive layer (not shown) to the other substrate 38. Moreover, if the cut-out portions 34 are ferromagnetic, a permanently magnetic material may be chosen for the other substrate 38. Moreover, if the cut-out portions 34 and the cutting die 14 are conductive, they may be electrically charged to ease separation. Once the cut-out portions 34 are removed, another nano-structure 36 as the one shown in FIG. 12 may be produced by repeating the process.

Figure 13:
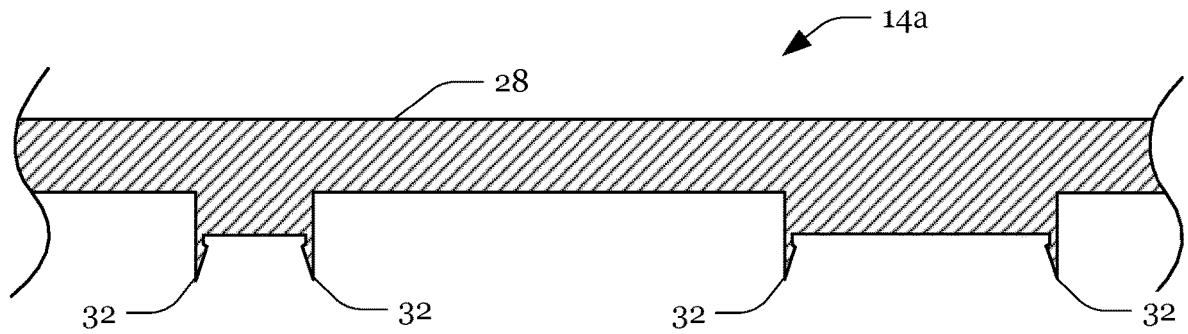
FIG. 13 to FIG. 17 show modified cutting dies.

FIG. 13 shows a modified cutting die 14a with edges 32 having barbed inner surfaces which may further increase the adherence of the cut-out portions 34 to the cutting die 14a. If the cutting die 14a is used, the cut-out portions 34 may be removed from the cutting die 14a by (wet) etching. Notably, (wet) etching may also be used to remove the cut-out portions 34 from the cutting die 14 that has edges 32 with no barbed inner surfaces.

Figure 14:
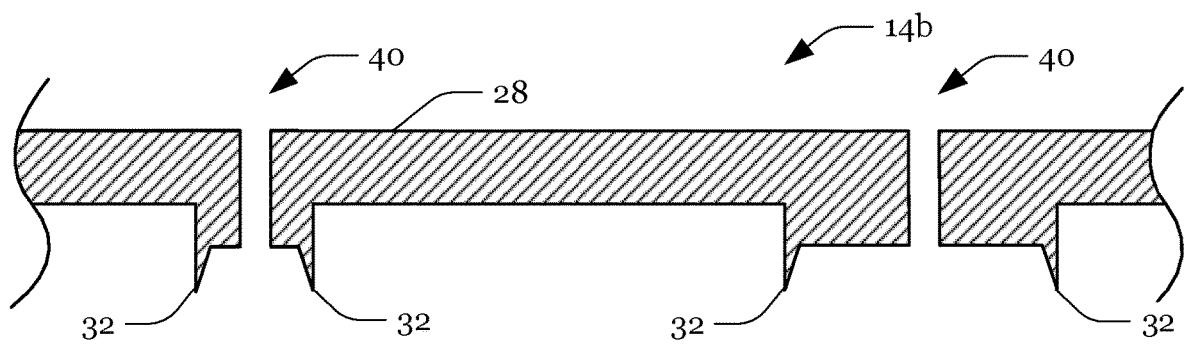

FIG. 14 shows a modified cutting die 14b with vias 4o extending from the surface areas 30. The vias 4o may extend through the base 28 and avoid that gas (e.g., inert gas, air, etc.) is trapped between the edges 32 and the cut-out portions 34. Moreover, the air pressure in the cavities formed by the edges 32 and the cut-out portions 34 may be actively controlled to change the adherence of the cut-out portions 34 to the cutting die 14b. For example, the cavities may be evacuated to pull (or when pulling) the cut-out portions 34 from the substrate 22 and/or pressurized to remove (or when removing) the cut-out portions 34 from the cutting die 14b. Notably, the modifications of FIG. 13 and FIG. 14 may also be combined.

Figure 15:
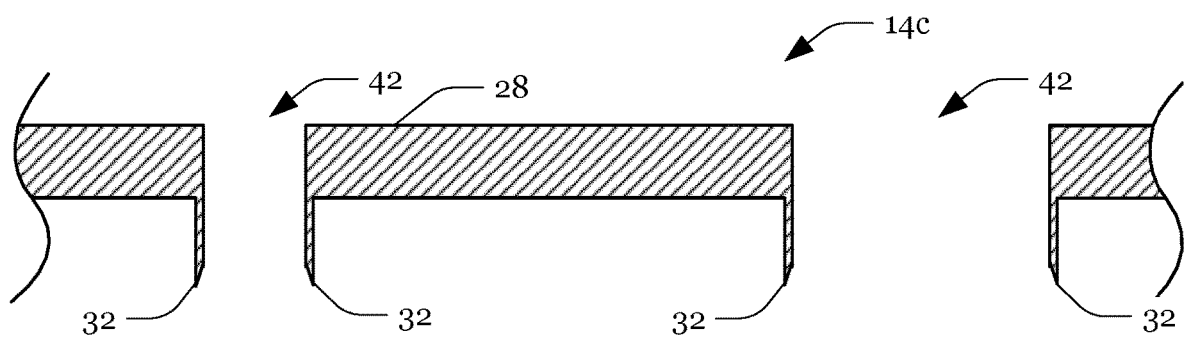
Figure 16:
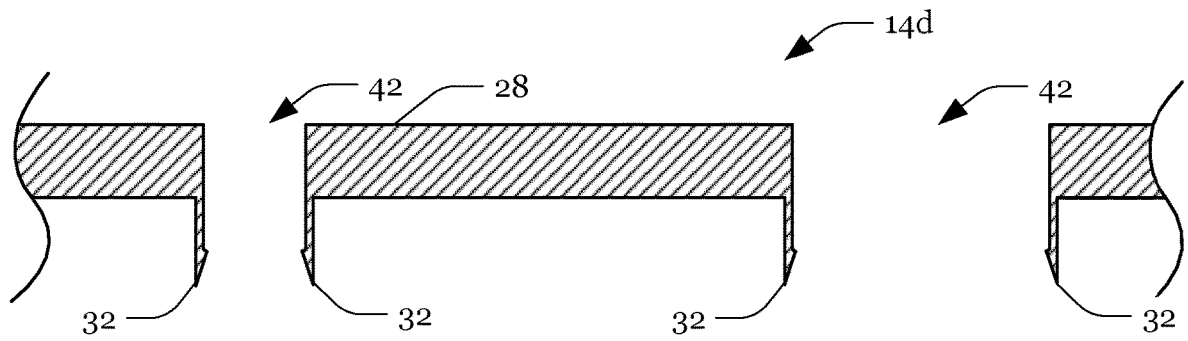

FIG. 15 shows a modification where the cut-out portions 34 may be removed from the cutting die 14c by guiding the cut-out portions 34 along channels 42 extending from the edges 32 through the cutting die 14c. For example, the channels 42 may be evacuated such that the cut-out portions 34 are forced by a gas stream along the channels 42 away from the edges 32. As shown in FIG. 16, the modifications of FIG. 13 and FIG. 15 may also be combined, in case of which evacuating the channels 42 may no longer be required, as the barbed inner surfaces prevent the cut-out-portions 34 from leaving the channels 42 in the wrong direction. Thus, stacks of cut-out portions 34 may pile up in the channels 42 and leave the cutting die 14d through the base side openings of the channels 42. Moreover, as shown in FIG. 17, the cut-out portions 34 may be removed from the cutting die 14e by pushing barbed rods 44 through the cut-out portions 34 and consecutively withdrawing the barbed rods 44 from the cutting die 14e.

Figure 17:
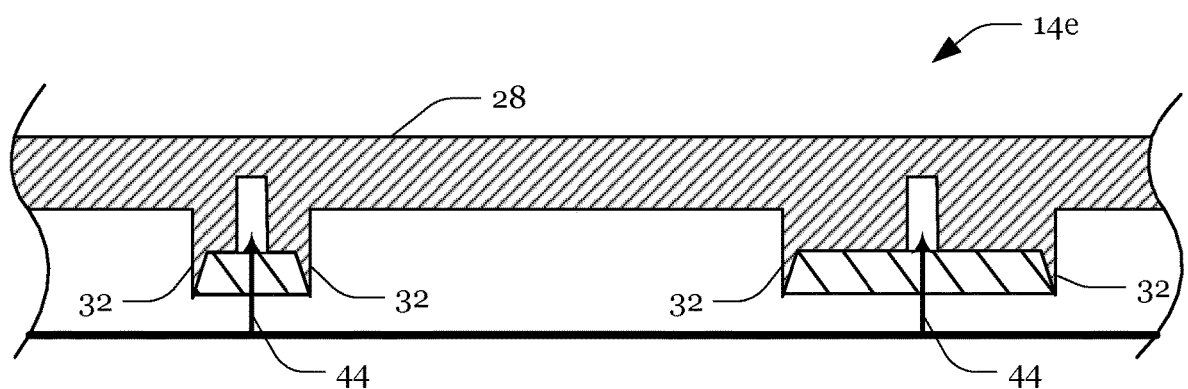

Furthermore, the cutting die 14e of FIG. 17 may also be used for vacuum-fixing the cut-out portions 34 to the cutting die 14e. For example, before (or when) the cutting die 14e is applied to the material layer 12, the pressure of the fluid around the cutting die 14e may be reduced. Before removing the cut-out portions 34 from the substrate 22, the pressure of the fluid around the cutting die 14e and the cut-out portions 34 may be increased such that a pressure of the fluid in the cavities formed by the cutting die 14e and the cut-out portions 34 is lower than the pressure of the fluid surrounding the cutting die 14e and the cut-out portions 34. In other words, instead of evacuating the cavities formed by the edges 32 and the cut-out portions 34 as described with reference to FIG. 14, the same or a similar effect may be achieved by controlling the pressure of the fluid in which the process is performed. Likewise, the cut-out portions 34 may be removed from the cutting die 14e by decreasing the pressure of the fluid surrounding the cutting die 14e and the cut-out portions 34. When the pressure within the cavities becomes higher than the pressure surrounding the cutting die 14e and the cut-out portions 34, the cut-out portions 34 may be urged from the cutting die 14e.

Figure 18:
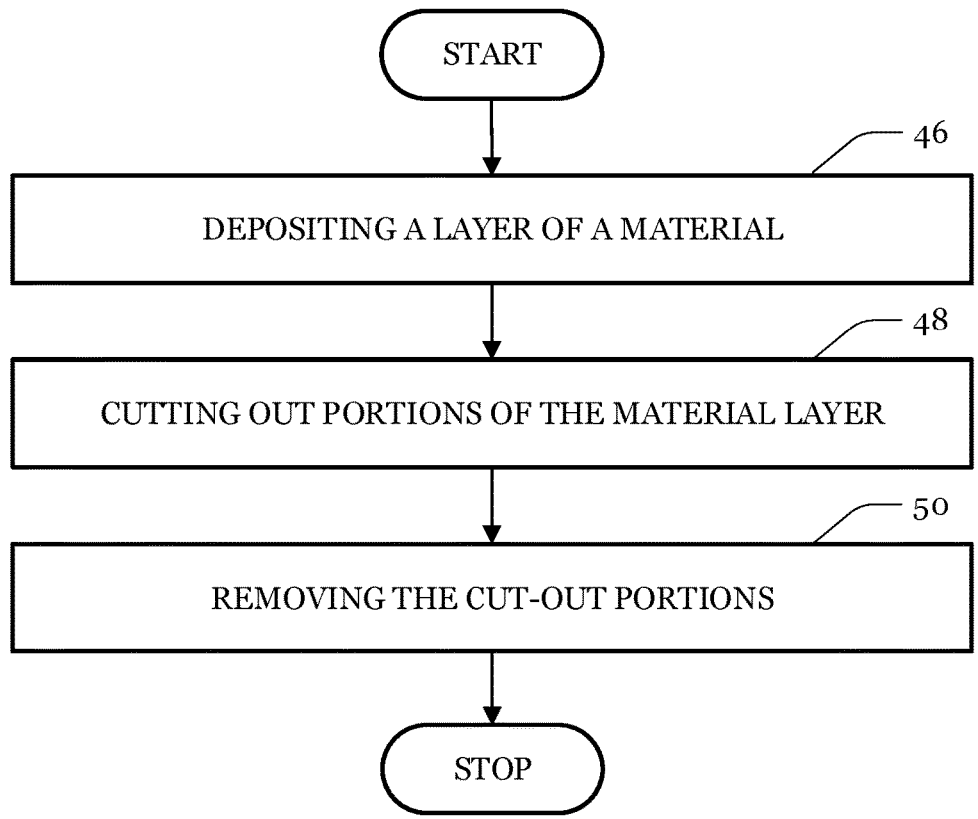
FIG. 18 shows a flow-chart of a process of manufacturing nano-structures from a material layer on a substrate.

FIG. 18 shows a flow-chart of the process of manufacturing nano-structures 36 which may be carried-out by employing the previously described elements of the apparatus 10. The process starts with a step 46 of depositing the material layer 12. At step 48, the process is continued by cutting out portions 34 of the material layer 48. Finally, at step 50, the cut-out portions 34 are removed. In a further step, the cut-out portions 34 may be reused. For example, the cut-out portions 34 may be arranged on another substrate (not shown).

LIST OF REFERENCE NUMERALS 10 apparatus
12 material layer
14 cutting die
14a cutting die
14b cutting die
14c cutting die
14d cutting die
14e cutting die
16 support
18 sensor
20 controller
22 substrate
24 structuring device
26 linear bearing
28 base
30 coplanar surface areas
32 edge
32a outer side (edge)
32b inner side (edge)
34 cut-out portions
36 nano-structure
38 substrate
40 via
42 channel
44 barbed rod
46 process step
48 process step
50 process step
A direction perpendicular to the coplanar surface areas
C1 height
C2 height
G gap
H edge height
T material layer thickness

The invention claimed is:

1. A method of manufacturing nano-structures on a substrate, the method comprising:
depositing a material layer on the substrate, wherein the material layer has a thickness below 1 μm;
moving a cutting die toward the material layer having the thickness below 1 μm, the cutting die having protruding portions each with a circumferential cutting edge that encircles an opening or a recess, the cutting edge of each protruding portion having a transverse cross section that is asymmetrical and that includes an inner side facing the opening or recess and an opposing outer side, the inner side comprising a barb or being sloped toward the opening or recess;

pressing the cutting die against the material layer so that the cutting edge of each protruding portion cuts out a portion of the material layer that is encircled by the cutting edge; and removing the cut-out portions from the substrate.

2. The method of claim 1, wherein the cut-out portions are mechanically removed from the substrate.

3. The method of claim 1, wherein the cut-out portions of the material layer are removed from the substrate by withdrawing the cutting die, thereby pulling the cut-out portions off the substrate.

4. The method of claim 3, wherein the cut-out portions are in mechanical contact with and adhere to the protruding portions when pulling the cut-out portions off the substrate.

5. The method of claim 1, wherein, while applying the cutting die to the material layer, the cutting die does not make contact with coplanar surface areas of non-cut-out portions of the material layer which remain on the substrate after having removed the cut-out portions from the substrate.

6. The method of claim 5, wherein a gap is maintained between coplanar surface areas of the cutting die and said coplanar surface areas of the of non-cut-out portions of the material layer.

7. The method of claim 1, wherein, while applying the cutting die to the material layer, portions of the material layer which remain on the substrate after having removed the cut-out portions from the substrate do not, except for the edge, come into contact with the cutting die.

8. The method of claim 1, wherein adhesive forces between the material layer and the cutting die are stronger than adhesive forces between the material layer and the substrate.

9. The method of claim 1, wherein removing the cut-out portions from the substrate is performed in a first fluid having a first pressure which is higher than a second pressure of a second fluid between the cut-out portions and the cutting die.

10. The method of claim 1, wherein applying the cutting die to the material layer comprises moving the cutting die parallel to a crystal axis of the material layer.

11. The method of claim 1, wherein the material layer comprises a crystalline homogeneous metal.

12. The method of claim 1, wherein the substrate comprises a glass.

13. The method of claim 1, further comprising:
integrating the nano-structures into opto-electronic devices.

14. A method for manufacturing nano-structures on a substrate, the method comprising:
depositing a material layer on the substrate so that the material layer has an exposed top surface and a thickness below 1 µm;

moving a cutting die toward the material layer having the thickness below 1 µm, the cutting die having a protruding portion with a circumferential cutting edge that encircles a recess bounded by a floor surface area;

pressing the cutting die against the material layer so that the cutting edge cuts out a portion of the material layer that is encircled by the cutting edge and the exposed top surface of the substrate is in direct mechanical contact with the floor surface area bounding the recess; and removing the cut out portion of the material layer from the substrate.

15. The method of claim 14, wherein the cut-out portion has a top face and an opposing bottom face that each extend to an encircling perimeter edge at the cutting, the top face and the bottom face of the cut-out portion being planar and disposed in parallel alignment except for at adjacent to the encircling perimeter edge.

16. A method of manufacturing nano-structures on a substrate, the method comprising:
depositing a material layer on the substrate, wherein the material layer has a thickness below 1 µm;

cutting out portions of the material layer, wherein cutting out portions of the material layer includes applying a cutting die to the material layer, the cutting die having protruding portions with circumferential edges, the edges cutting through the material layer when the cutting die is applied to the material layer; and removing the cut-out portions from the substrate, wherein, while applying the cutting die to the material layer, portions of the material layer which remain on the substrate after having removed the cut-out portions from the substrate do not, except for the edge, come into contact with the cutting die.

17. A method for manufacturing nano-structures on a first substrate, the method comprising:
depositing a material layer on the first substrate so that the material layer has a thickness below 1 µm;

moving a cutting die toward the material layer having the thickness below 1 µm, the cutting die having a protruding portion with a circumferential cutting edge;

pressing the cutting die against the material layer so that the cutting edge cuts out a portion of the material layer that is encircled by the cutting edge;

moving the cutting die away from the first substrate while the cut-out portion remains disposed on the cutting die, the cut-out portion being secured to the cutting die by a first adhesive force; and positioning the cut-out portion secured to the cutting die against a second substrate, a second adhesive force between the cut-out portion and the second substrate being greater than the first adhesive force between the cut-out portion and the cutting die.

* * * * *